(12) United States Patent
Hwang et al.

(10) Patent No.: US 9,595,542 B2
(45) Date of Patent: Mar. 14, 2017

(54) THIN FILM TRANSISTOR ARRAY PANEL AND MANUFACTURING METHOD THEREOF

(71) Applicant: Samsung Display Co., Ltd., Yongin, Gyeonggi-Do (KR)

(72) Inventors: Hyun Ki Hwang, Seongnam-si (KR); Sung Man Kim, Seoul (KR); Won Ho Kim, Seongnam-si (KR); Yu Jin Lee, Asan-si (KR); Young Je Cho, Asan-si (KR); Tae Hyung Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 92 days.

(21) Appl. No.: 14/106,782

(22) Filed: Dec. 15, 2013

(65) Prior Publication Data

US 2015/0060866 A1    Mar. 5, 2015

(30) Foreign Application Priority Data

Aug. 30, 2013  (KR) .......................... 10-2013-0103977

(51) Int. Cl.
  *H01L 27/12*  (2006.01)
(52) U.S. Cl.
  CPC ........ *H01L 27/124* (2013.01); *H01L 27/1248* (2013.01)
(58) Field of Classification Search
  CPC .......................... H01L 27/124; H01L 27/1248
  USPC ..... 257/72; 438/48, 128, 149, 151, 157, 283
  See application file for complete search history.

(56) References Cited

U.S. PATENT DOCUMENTS

| 5,990,987 | A | 11/1999 | Tanaka | |
|---|---|---|---|---|
| 6,506,617 | B1 | 1/2003 | Cheng | |
| 2006/0102907 | A1* | 5/2006 | Lee | H01L 27/1214 257/72 |
| 2010/0001276 | A1* | 1/2010 | Kim | G02F 1/136227 257/59 |
| 2010/0117980 | A1* | 5/2010 | Lee | G02F 1/13338 345/173 |
| 2010/0133539 | A1* | 6/2010 | Kang | H01L 27/12 257/59 |
| 2011/0141421 | A1* | 6/2011 | Lee | G02F 1/134309 349/138 |
| 2011/0249228 | A1 | 10/2011 | Kubota et al. | |

(Continued)

FOREIGN PATENT DOCUMENTS

JP     05-241133 A   9/1993
KR  1020070072275 A  7/2007

(Continued)

*Primary Examiner* — John C Ingham
*Assistant Examiner* — Didarul Mazumder
(74) *Attorney, Agent, or Firm* — Cantor Colburn LLP

(57) ABSTRACT

A thin film transistor array panel includes a first insulation substrate, a gate line and a data line which are positioned on the first insulation substrate, are insulated from each other, and cross each other, a thin film transistor connected to the gate line and the data line, an organic film positioned on the thin film transistor, a second passivation layer which is positioned on the organic film and defines a plurality of second openings therein, a common electrode positioned on the second passivation layer, and a pixel electrode positioned in the plurality of second openings, where a thickness of the common electrode is larger than a thickness of the pixel electrode.

10 Claims, 34 Drawing Sheets

(56) References Cited

U.S. PATENT DOCUMENTS

| | | | |
|---|---|---|---|
| 2011/0254815 A1* | 10/2011 | Kim | G02F 1/136227 |
| | | | 345/204 |
| 2013/0001579 A1* | 1/2013 | Jung | H01L 27/088 |
| | | | 257/72 |
| 2013/0043477 A1* | 2/2013 | Jang | H01L 27/1259 |
| | | | 257/59 |

FOREIGN PATENT DOCUMENTS

| KR | 1020080062945 A | 7/2008 |
|---|---|---|
| KR | 1020090054194 A | 5/2009 |
| KR | 1020130017744 A | 2/2013 |

* cited by examiner

THIN FILM TRANSISTOR ARRAY PANEL AND MANUFACTURING METHOD THEREOF

This application claims priority to Korean Patent Application No. 10-2013-0103977 filed on Aug. 30, 2013, and all the benefits accruing therefrom under 35 U.S.C. §119, the entire contents of which are incorporated herein by reference.

BACKGROUND (a) Technical Field

The invention relates to a thin film transistor array panel and a manufacturing method thereof.

(b) Description of the Related Art

A liquid crystal display ("LCD") which is one of the most common types of flat panel displays currently in use, is a display device which rearranges liquid crystal molecules of a liquid crystal layer by applying voltages to electrodes to control an amount of transmitted light.

The LCD has an advantage in that a thin film may be easily formed, but there is a disadvantage in that side visibility deteriorates as compared with front visibility. In order to solve the disadvantage, various types of alignments of the liquid crystal and driving methods have been developed. As a method for implementing a wide viewing angle, an LCD in which a pixel electrode and a common electrode are disposed on one substrate has received attention.

In the case of such an LCD, cutouts are defined in at least one of two field generating electrodes of the pixel electrode and the common electrode and a plurality of branch electrodes of the respective electrode is defined by the plurality of cutouts.

SUMMARY

In a case of forming two field generating electrodes on one display panel, in order to form the respective field generating electrodes, different photomasks are used, and as a result, manufacturing costs are increased.

The invention has been made in an effort to provide a thin film transistor ("TFT") array panel and a manufacturing method thereof having advantages of effectively preventing an increase in manufacturing costs while two field generating electrodes are disposed on one display panel.

An exemplary embodiment of the invention provides a TFT array panel, including a first insulation substrate, a gate line and a data line which are positioned on the first insulation substrate, are insulated from each other, and cross each other, a TFT connected to the gate line and the data line, an organic film positioned on the TFT, a second passivation layer which is positioned on the organic film and defines a plurality of second openings therein, a common electrode positioned on the second passivation layer, and a pixel electrode positioned in the plurality of second openings, in which a thickness of the common electrode is larger than a thickness of the pixel electrode.

In an exemplary embodiment, the common electrode may have a double layer structure.

In an exemplary embodiment, the TFT array panel may further include a first passivation layer which is positioned on the TFT and defines a plurality of first openings therein, in which the plurality of first openings may overlap with some of the plurality of second openings.

In an exemplary embodiment, the pixel electrode and a part of the common electrode may overlap with each other, and provide a storage electrode.

Another exemplary embodiment of the invention provides a TFT array panel, including a first insulation substrate, a gate line and a data line which are positioned on the first insulation substrate, are insulated from each other, and cross each other, a TFT connected to the gate line and the data line, a first passivation layer which is positioned on the TFT and defines a first opening therein, a second passivation layer which is positioned on the first passivation layer and defines a second opening therein, a common electrode positioned on the second passivation layer, and a pixel electrode positioned in the second opening, in which a thickness of the common electrode is larger than a thickness of the pixel electrode.

In an exemplary embodiment, the first opening and the second opening may be in plural and correspond to each other, respectively, and the common electrode may have a double layer structure.

In an exemplary embodiment, the TFT array panel may further include a gate insulating layer positioned on the gate line.

In an exemplary embodiment, the second passivation layer may include an undercut.

In an exemplary embodiment, the pixel electrode and a part of the common electrode may overlap with each other, and provide a storage electrode.

In an exemplary embodiment, a part of the pixel electrode may contact the first insulation substrate.

Yet another exemplary embodiment of the invention provides a manufacturing method of a TFT array panel, including forming a gate line on a first insulation substrate, forming a gate insulating layer on the gate line, forming a data line on the gate insulating layer, laminating a first insulating layer and an organic layer on the data line, defining a first opening in a first passivation layer and providing an organic film by etching the first insulating layer and the organic layer, respectively, laminating a second insulating layer and a first conductive layer on the organic film, defining a second opening in a second passivation layer and providing a common electrode by etching the second insulating layer and the first conductive layer, respectively, and laminating a second conductive layer on the common electrode and in the second opening, in which the second conductive layer laminated in the second opening provides a pixel electrode.

In an exemplary embodiment, the first conductive layer may be wet-etched, and the second insulating layer may be dry-etched.

In an exemplary embodiment, the second insulating layer may include an undercut.

In an exemplary embodiment, the common electrode may have a double layer structure.

In an exemplary embodiment, the first opening and the second opening may be in plural, and first openings may correspond to some of second openings, respectively.

Still another exemplary embodiment of the invention provides a manufacturing method of a TFT array panel, including forming a gate line on a first insulation substrate, forming a gate insulating layer on the gate line, forming a data line on the gate insulating layer, laminating a first insulating layer, a second insulating layer, and a first conductive layer on the data line in sequence, forming a photosensitive film pattern on the first conductive layer, forming a common electrode by etching the first conductive layer by using the photosensitive film pattern as a mask, defining an opening by etching the second insulating layer, the first insulating layer, and the gate insulating layer by using the same photosensitive film pattern used in etching the first conductive layer, as a mask, and laminating a second conductive layer on the common electrode and in the opening, in which the second conductive layer positioned in the opening provides a pixel electrode.

In an exemplary embodiment, the first conductive layer may be wet-etched, and the second insulating layer, the first insulating layer, and the gate insulating layer may be dry-etched.

In an exemplary embodiment, the second insulating layer may include an undercut.

In an exemplary embodiment, the second insulating layer may include an undercut.

In an exemplary embodiment, the openings may include a plurality of first opening portions defined by etching the first insulating layer, and a plurality of second opening portions defined by etching the second insulating layer, the first insulating layer may be etched to define the first opening portions in a first passivation layer, and the second insulating layer may be etched to define the second opening portions in a second passivation layer.

According to the exemplary embodiments of the invention, it is possible to effectively prevent an increase in manufacturing costs while two field generating electrodes are disposed on one display panel.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
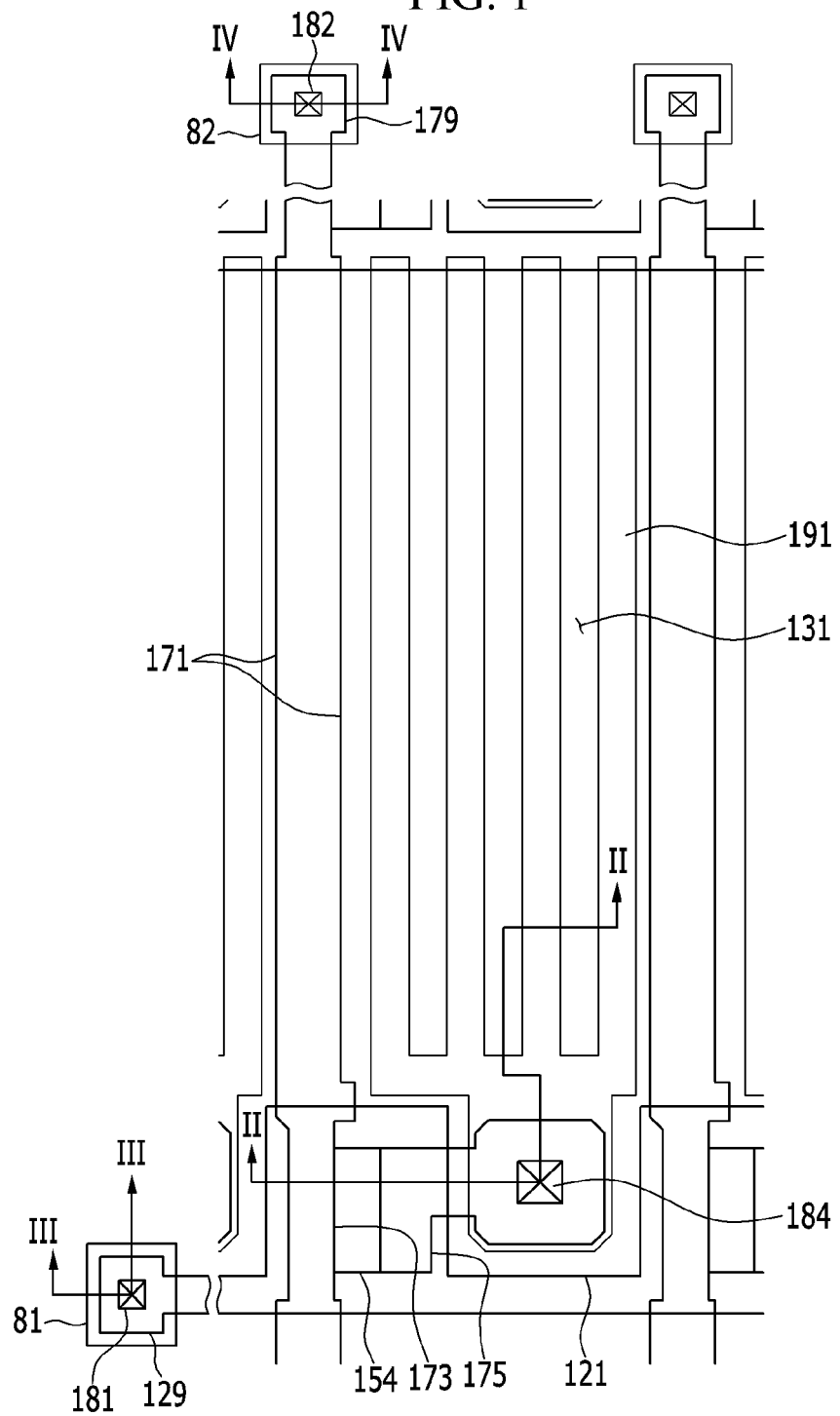
FIG. 1 is a plan view of one pixel of an exemplary embodiment of a thin film transistor ("TFT") array panel according to the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a thin film transistor ("TFT") array panel according to an exemplary embodiment of the invention will be described with reference to the accompanying drawings.

Figure 2:
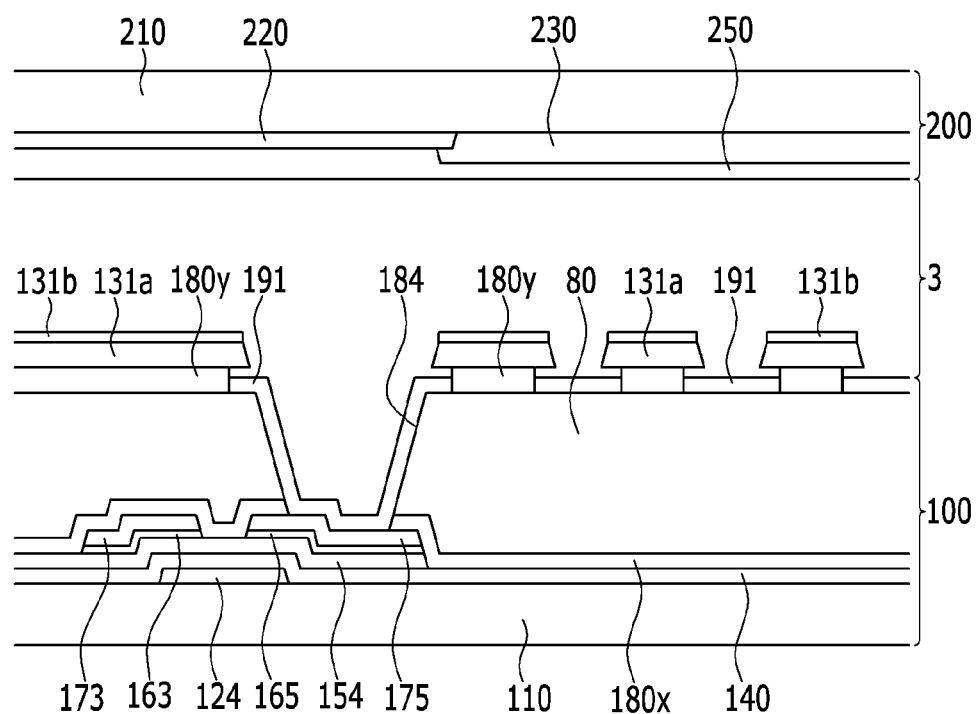
FIG. 2 is a cross-sectional view of the TFT array panel of FIG. 1 taken along line II-II.
Figure 3:
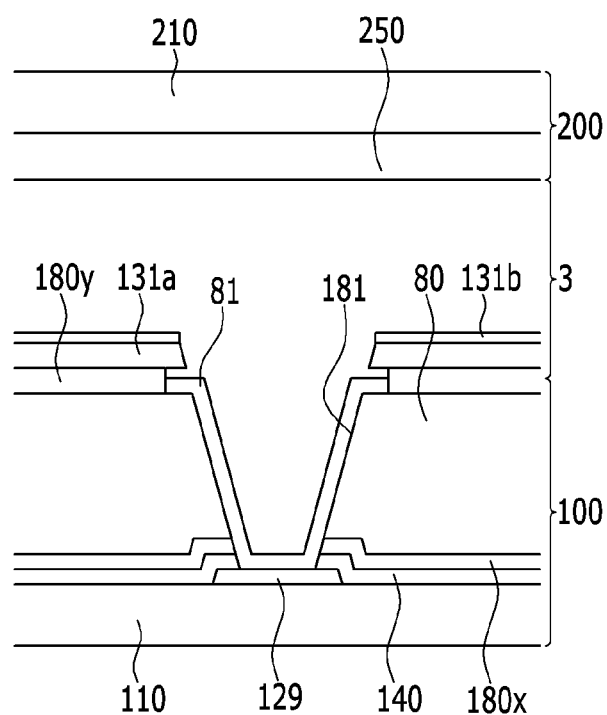
FIG. 3 is a cross-sectional view of the TFT array panel of FIG. 1 taken along line III-III.
Figure 4:
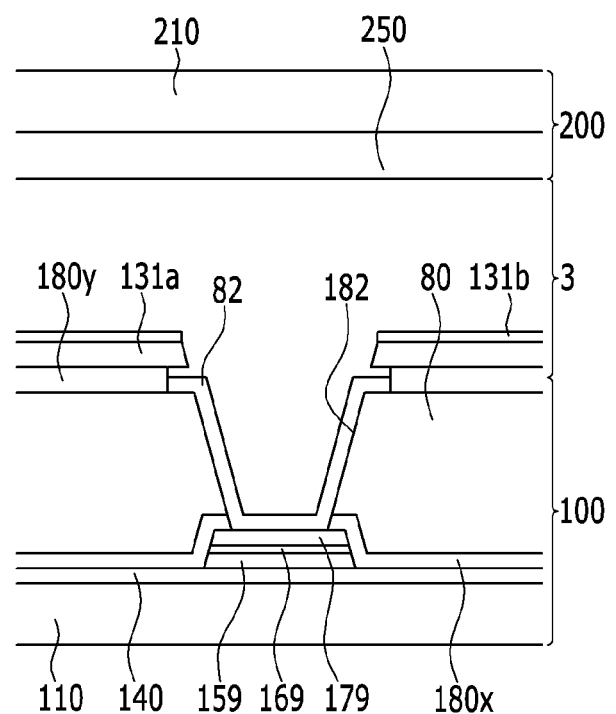
FIG. 4 is a cross-sectional view of the TFT array panel of FIG. 1 taken along line IV-IV.

FIG. 1 is a plan view of one pixel of a TFT array panel according to an exemplary embodiment of the invention. FIG. 2 is a cross-sectional view of the TFT array panel of FIG. 1 taken along line II-II. FIG. 3 is a cross-sectional view of the TFT array panel of FIG. 1 taken along line III-III. FIG. 4 is a cross-sectional view of the TFT array panel of FIG. 1 taken along line IV-IV.

Referring to FIGS. 1 to 4, a display device according to an exemplary embodiment of the invention includes a TFT array panel 100 (also referred to as a lower panel) and an upper panel 200 facing each other, and a liquid crystal layer 3 interposed therebetween.

First, the TFT array panel 100 will be described.

A gate conductor including a gate line 121 is disposed on a first insulation substrate 110 including transparent glass, plastic, or the like.

The gate line 121 includes and a gate electrode 124 and a wide gate pad part 129 for connection with another layer or an external driving circuit. In an exemplary embodiment, the gate line 121 may include aluminum-based metal such as aluminum (Al) or an aluminum alloy, silver-based metal such as silver (Ag) or a silver alloy, copper-based metal such as copper (Cu) or a copper alloy, molybdenum-based metal such as molybdenum (Mo) or a molybdenum alloy, chromium (Cr), tantalum (Ta), and titanium (Ti), for example. However, the gate line 121 may have a multilayered structure including at least two conductive layers having different physical properties.

In an exemplary embodiment, a gate insulating layer 140 including silicon nitride (SiNx), silicon oxide (SiOx), or the like is disposed on the gate conductor 121, 124, and 129. The gate insulating layer 140 may have a multilayered structure including at least two insulating layers having different physical properties.

A semiconductor 154 including amorphous silicon or polysilicon is disposed on the gate insulating layer 140. The semiconductor 154 may include an oxide semiconductor.

Ohmic contacts 163 and 165 are disposed on the semiconductor 154. The ohmic contacts 163 and 165 may include a material such as n+ hydrogenated amorphous silicon in which n-type impurity such as phosphorus is doped at high concentration or silicide. The ohmic contacts 163 and 165 may be disposed on the semiconductor 154 to make a pair. In the case where the semiconductor 154 is an oxide semiconductor, the ohmic contacts 163 and 165 may be omitted.

A data conductor including a data line 171 including a source electrode 173 and a drain electrode 175 is disposed on the ohmic contacts 163 and 165 and the gate insulating layer 140.

The data line 171 includes a data pad part 179 for connection with another layer or an external driving circuit. The data lines 171 transfer data signals and mainly extend in a vertical direction to cross the gate lines 121.

The source electrode 173 is a part of the data line 171, and disposed on the same line as the data line 171. The drain electrode 175 is extends in parallel with the source electrode 173. Accordingly, the drain electrode 175 is parallel with the part of the data line 171.

The drain electrode 175 includes a rod-shaped end portion which faces the source electrode 173 with reference to the gate electrode 124, and the other end portion having a large area.

Referring to FIGS. 1 and 4, a first semiconductor 159 is disposed below the data pad part 179 and a first contact assistant 82 is disposed on the data pad part 179. In another exemplary embodiment, the first semiconductor 159 and the first contact assistant 82 may be omitted.

The gate electrode 124, the source electrode 173, and the drain electrode 175 form one TFT together with the semiconductor 154, and a channel of the TFT is positioned in the semiconductor 154 between the source electrode 173 and the drain electrode 175.

The TFT array panel according to the exemplary embodiment of the invention includes the source electrode 173 positioned on the same line as the data line 171 and the drain electrode 175 extending in parallel with the data line 171, and as a result, a width of the TFT may be increased while an area of the data conductor is not increased, thereby increasing an aperture ratio of the liquid crystal display ("LCD").

However, in the case of a TFT array panel according to another exemplary embodiment of the invention, the source electrode 173 and the drain electrode 175 may have different shapes.

In an exemplary embodiment, the data line 171 and the drain electrode 175 may include refractory metal such as molybdenum, chromium, tantalum, and titanium or an alloy thereof, and may have a multilayered structure including a refractory metal layer (not illustrated) and a low resistive conductive layer (not illustrated). In an exemplary embodiment, the multilayered structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, the data line 171 and the drain electrode 175 may include various metals or conductors in addition to the metal.

A first passivation layer 180x is disposed on the data conductor 171, 173, 175, and 179, the gate insulating layer 140, and an exposed portion of the semiconductor 154. The first passivation layer 180x may include an organic insulating material or an inorganic insulating material.

Further, a plurality of first openings is defined in the first passivation layer 180x, and the plurality of first openings may be defined at a location exposing a part of the drain electrode 175 or exposing the gate pad part 129 and the data pad part 179.

Further, the plurality of first openings may be defined at a location corresponding to or the same location as the contact hole included in the organic film.

An organic film 80 is disposed on the first passivation layer 180x. The organic film 80 has a thickness larger than that of the first passivation layer 180x and may have a flat surface.

A first thickness of the organic film 80 positioned in a display area in which a plurality of pixels is positioned to display an image may be larger than a second thickness of the organic film 80 positioned in a peripheral area in which the gate pad part 129 or the data pad part 179 is provided.

The organic film 80 is disposed in the display area where the plurality of pixels is positioned, but may not be positioned in the peripheral area where the gate pad part or the data pad part is provided.

In another exemplary embodiment of the invention, the organic film 80 may be omitted.

Referring to FIGS. 2 to 4, the organic film 80 is removed from regions corresponding to the drain electrode 175, the gate pad part 129, and the data pad part 179.

A first contact hole 181 exposing the gate pad part 129 is provided in the first passivation layer 180x positioned in the region corresponding to the gate pad part 129 where the organic film 80 is removed and the gate insulating layer 140.

A second contact hole 182 exposing the data pad part 179 is provided in the first passivation layer 180x positioned in the region corresponding to the data pad part 179 where the organic film 80 is removed.

A third contact hole 184 is defined in the organic film 80 and the first passivation layer 180x positioned in the region corresponding to the drain electrode 175.

That is, as described above, a first opening defined in the first passivation layer 180x may correspond to the contact holes defined in the organic film 80.

Next, a second passivation layer 180y is positioned on the organic film 80. A plurality of second openings is defined in the second passivation layer 180y. Any one of the plurality of second openings exposes the drain electrode, some of the second openings are defined in the organic film, and other second openings are defined to expose the gate pad part or the data pad part.

A predetermined second opening exposing the drain electrode corresponds to the third contact hole 184, a predetermined second opening exposing the gate pad part 129 corresponds to the first contact hole 181, and the second opening exposing the data pad part 179 corresponds to the second contact hole 182. Further, the plurality of second openings includes an opening which does not correspond to the contact hole of the organic film described above, but exposes the organic film 80.

In an exemplary embodiment, the second passivation layer 180y may include the same as or similar material or to the first passivation layer 180x, and in this case, may include an undercut due to etching.

Next, the common electrode 131 is positioned on the second passivation layer 180y. The common electrode 131 may include a transparent conductive layer such as indium tin oxide ("ITO") or indium zinc oxide ("IZO"), but is not limited thereto and may include transparent conducting oxide ("TCO"). The common electrodes 131 positioned on the second passivation layer 180y may have the same plane shape as the second passivation layer 180y. That is, the common electrode is not positioned on the opening defined in the second passivation layer 180y, but positioned only on the second passivation layer 180y.

Particularly, the common electrode according to the exemplary embodiment of the invention is provided to be slightly thick as the conductive layer providing the pixel electrode is laminated even on the common electrode. When the pixel electrode 191 include the same material as the common electrode 131, the common electrode 131 has a double structure including the same material and is thickly provided, and when the pixel electrode 191 include a different material from the common electrode 131, the common electrode is provided with a double layer structure due to the different materials while being thickly provided as described above. That is, the common electrode 131 is provided with the double structure through two laminations, but the double layer may be the same material or different materials.

In an exemplary embodiment of the invention, the common electrode 131 includes a common electrode portion 131a provided by a first conductive layer and a common electrode portion 131b provided by a second conductive layer. As described above, the first conductive layer and the second conductive layer may include the same material or different materials.

In an exemplary embodiment, the transparent conductive layer such as the TCO including ITO, IZO, or the like configuring the common electrode has slightly high resistance, and as described above, when the transparent conductive layer is thickly provided as described above, the resistance may be effectively reduced.

The pixel electrode 191 is positioned in the second opening defined in the second passivation layer 180y. In an exemplary embodiment, the pixel electrode 191 may also include a transparent conductive layer such as TCO including ITO or IZO.

The pixel electrode 191 is physically and electrically connected with the drain electrode 175 through the third contact hole 184 of the organic film 80 and the first opening of the first passivation layer 180x corresponding thereto and receives a voltage from the drain electrode 175.

Further, a first contact assistant 81 is disposed on the gate pad part 129 exposed through the first contact hole 181 and the predetermined first opening corresponding thereto, and a second contact assistant 82 is disposed on the data pad part 179 exposed through the second contact hole 182 and the predetermined first opening corresponding thereto.

In this case, the pixel electrode 191, the first contact assistant 81, and the second contact assistant 82 may be simultaneously disposed in and/or on the same layer.

Particularly, as illustrated in FIG. 2, the pixel electrode 191 may also be partitioned in the plurality of second openings provided on the organic film 80. The pixel electrode positioned on the organic film and positioned in the second opening generates an electric field together with the common electrode adjacent thereto to align a liquid crystal.

Further, the pixel electrode and the common electrode may overlap with each other in the undercut region by the aforementioned undercut. The same function may be performed by the overlapping without a separate storage electrode. Accordingly, a size of the storage electrode may be controlled by controlling the formation degree of the undercut when the etching is performed.

Although not illustrated, an alignment layer is coated on the pixel electrode 191 and the common electrode 131, and the alignment layer may be a vertical alignment layer and be rubbed in a predetermined direction. However, in another exemplary embodiment, the alignment layer may include a photoreactive material to be photo-aligned.

Next, the upper panel 200 will be described.

A light blocking member 220 is disposed on a second insulation substrate 210 including transparent glass or plastic. The light blocking member 220 is called a black matrix and blocks light leakage.

Further, a plurality of color filters 230 is disposed on the second insulation substrate 210.

An overcoat 250 is disposed on the color filter 230 and the light blocking member 220. The overcoat 250 may include an (organic) insulator, effectively prevents the color filter 230 from being exposed, and provides a flat surface. In another exemplary embodiment, the overcoat 250 may be omitted.

An alignment layer may be disposed on the overcoat 250.

The liquid crystal layer 3 includes a nematic liquid crystal material having positive dielectric anisotropy. The liquid crystal molecules of the liquid crystal layer 3 are aligned so that directions of long axes thereof are parallel to the panels 100 and 200, and the directions thereof have a 90° twisted structure in a spiral shape from a rubbing direction of the alignment layer of the TFT array panel 100 up to the upper panel 200.

The pixel electrode 191 receives a data voltage from the drain electrode 175, and the common electrode 131 receives a common voltage having a predetermined magnitude from a common voltage applying unit disposed outside of the display area.

The pixel electrode 191 and the common electrode 131 which are field generating electrodes generate an electric field and thus the liquid crystal molecules of the liquid crystal layer 3 positioned on the two electrodes 191 and 131 rotate in a direction parallel to the direction of the electric field. Polarization of light passing through the liquid crystal layer varies according to the determined rotation directions of the liquid crystal molecules.

In the TFT array panel according to the exemplary embodiment of the invention, the second passivation layer 180$y$, the common electrode 131, and the pixel electrode 191 may be provided together by using one photomask. As a result, an increase of manufacturing costs of the TFT array panel may be effectively prevented.

In the case of the TFT array panel according to the exemplary embodiment illustrated in FIGS. 1 to 4, the organic film 80 is positioned on the first passivation layer 180$x$ of the TFT array panel 100, and the color filter 230 and the light blocking member 220 are positioned on the upper panel 200. However, in the case of a TFT array panel according to another exemplary embodiment of the invention, the color filter 230 instead of the organic film 80 may be positioned on the TFT array panel 100, and color filter 230 may not be positioned on the upper panel 200. In this case, the light blocking member 220 may also be positioned on the TFT array panel 100, not the upper panel 200.

FIGS. 5 to 19 are cross-sectional views illustrating a manufacturing method of a TFT array panel according to an exemplary embodiment of the invention. FIGS. 5, 8, 11, 14, and 17 are cross-sectional views sequentially illustrating the manufacturing method of a TFT array panel according to the exemplary embodiment of the invention, which are cross-sectional views of the TFT array panel of FIG. 1 taken along line II-II. FIGS. 6, 9, 12, 15, and 18 are cross-sectional views sequentially illustrating the manufacturing method of a TFT array panel according to the exemplary embodiment of the invention, which are cross-sectional views of the TFT array panel of FIG. 1 taken along line III-III. FIGS. 7, 10, 13, 16, and 19 are cross-sectional views sequentially illustrating the manufacturing method of a TFT array panel according to the exemplary embodiment of the invention, which are cross-sectional views of the TFT array panel of FIG. 1 taken along line IV-IV.

Figure 5:
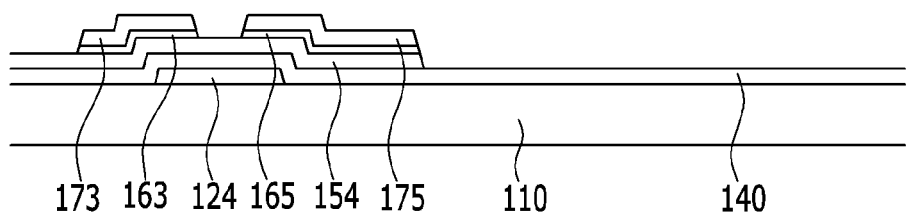
FIGS. 5 to 19 are cross-sectional views illustrating an exemplary embodiment of the invention a manufacturing method of a TFT array panel according to the invention.
Figure 6:
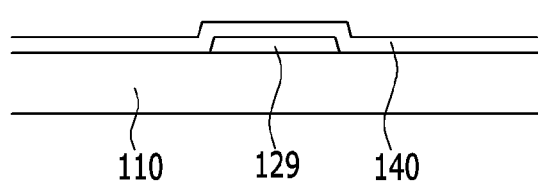
Figure 7:
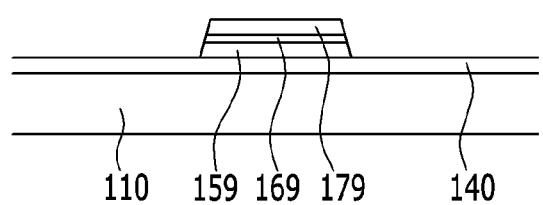

First, referring to FIGS. 5 to 7, the gate conductor 121, 124, and 129 including the gate line 121, the gate electrode 124, and the gate pad part 129 is disposed on the insulation substrate 110, and the gate insulating layer 140 is laminated thereon. The semiconductor 154, the first semiconductor 159, the ohmic contacts 163 and 165, the first ohmic contact 169, and the data conductor 171, 175, and 179 including the data line 171, the drain electrode 175, and the data pad part 179 are disposed on the gate insulating layer 140.

Figure 8:
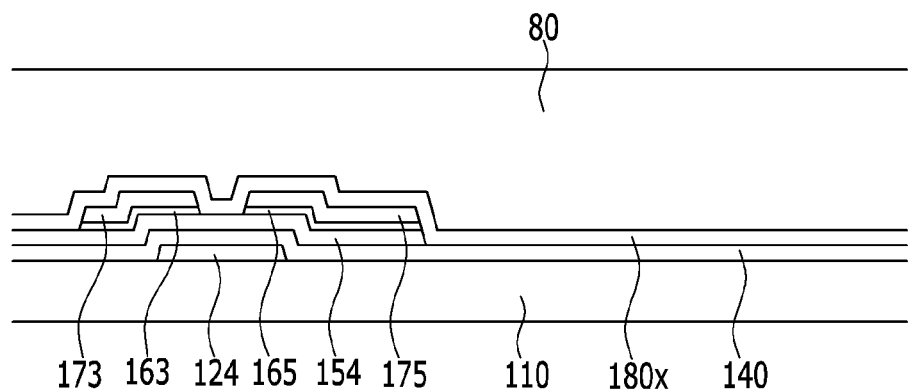
Figure 9:
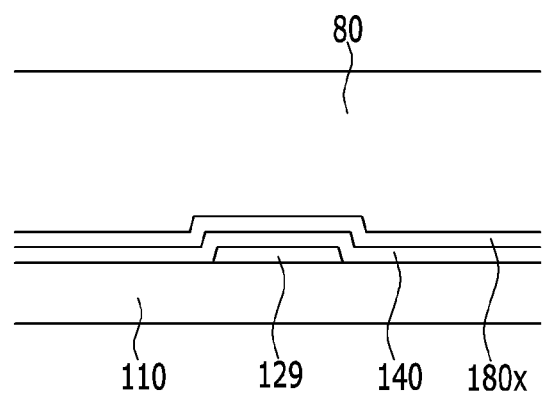
Figure 10:
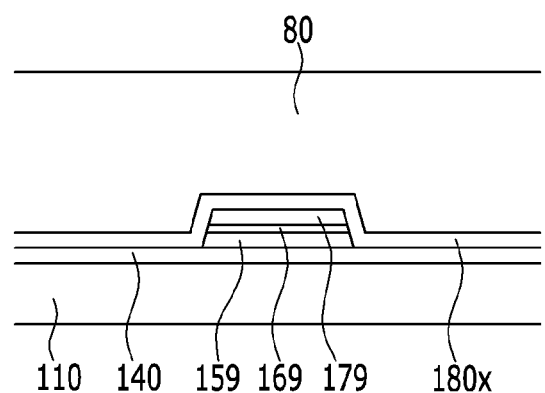

Next, as illustrated in FIGS. 8 to 10, the first passivation layer 180$x$ and the organic film 80 are laminated on the gate insulating layer 140, the data conductor 171, 175, and 179, and the exposed semiconductor 154.

Figure 11:
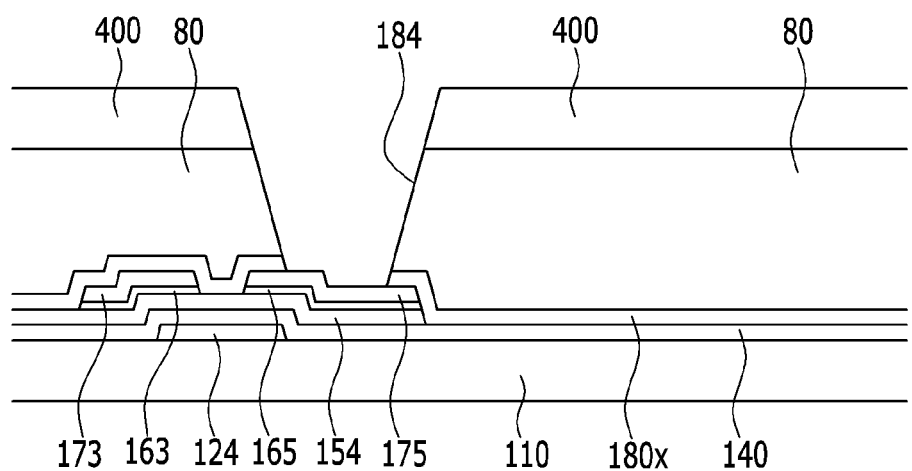
Figure 12:
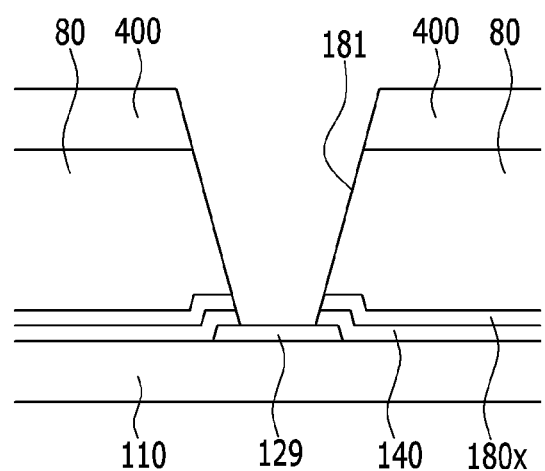
Figure 13:
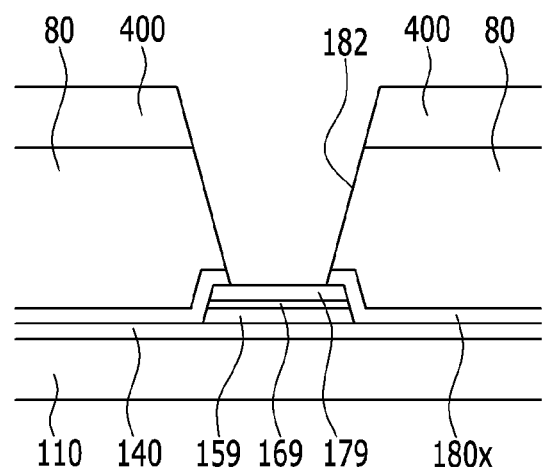

As illustrated in FIGS. 11 to 13, a photosensitive film pattern 400 is provided by laminating, exposing and developing a photosensitive film. Next, the organic film 80 and the first passivation layer 180$x$ are etched by using the photosensitive film pattern 400 as a mask. As a result, the organic film includes a plurality of contact holes and thus a plurality of first openings is defined in the first passivation layer 180$x$.

As illustrated in FIG. 11, the etched organic film and first passivation layer expose a part of the drain electrode. Further, referring to FIG. 12, the gate insulating layer 140 is also etched by the etching to expose the gate pad part 129. Further, as illustrated in FIG. 13, the data pad part 179 is exposed through etching of the organic film 80 and the first passivation layer 180$x$.

Figure 14:
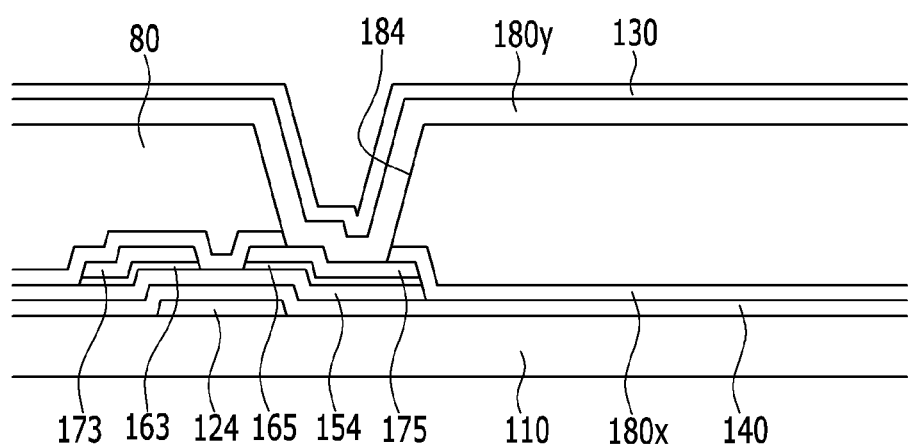
Figure 15:
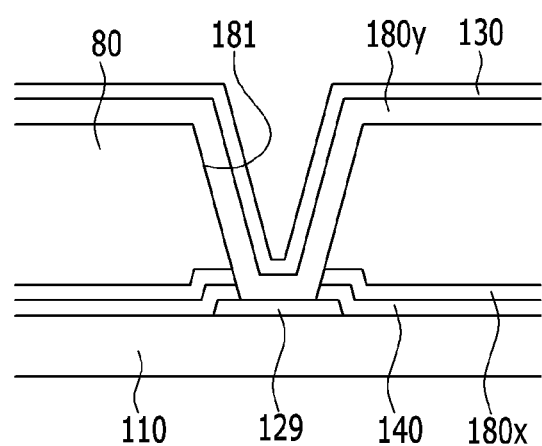
Figure 16:
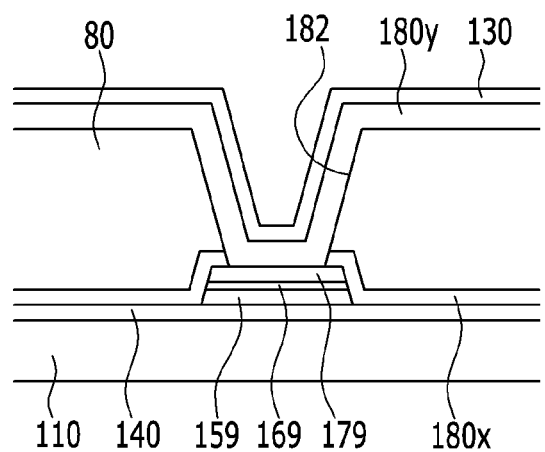

Next, referring to FIGS. 14 to 16, in the structure illustrated in FIGS. 11 to 13, the second passivation layer 180$y$ and the first conductive layer 130 are laminated after the photosensitive film pattern is removed. The second passivation layer 180$y$ and the first conductive layer 130 are positioned on the organic film 80 and also in the first openings defined through the etching.

Figure 17:
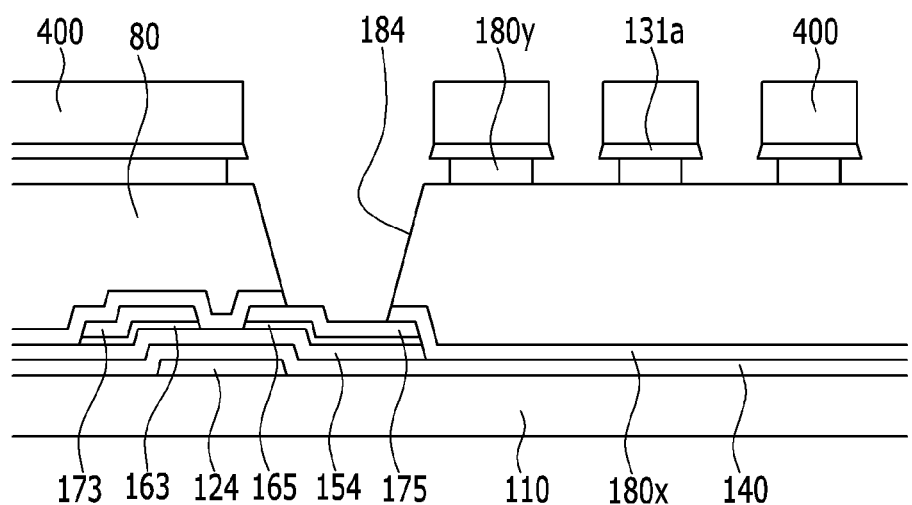
Figure 18:
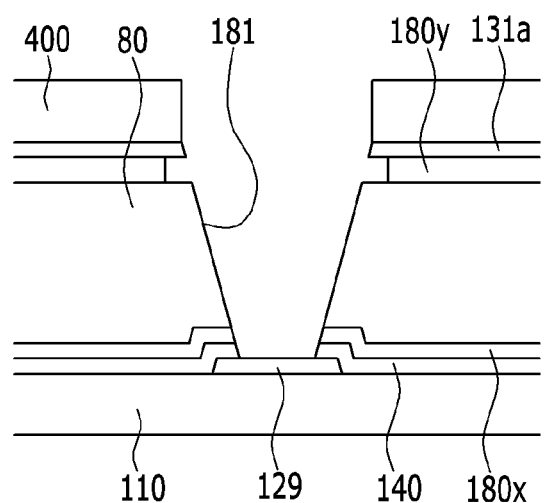
Figure 19:
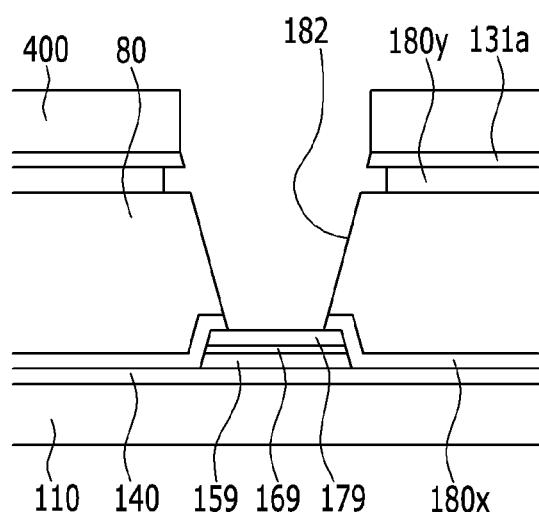

Next, referring to FIGS. 17 to 19, the photosensitive film pattern 400 is provided again by laminating, exposing, and developing the photosensitive film. The photosensitive film pattern 400 for etching the second passivation layer 180$y$ and the first conductive layer 130 may be the same photosensitive film pattern 400 for etching the organic film 80 and the first passivation layer 180$x$. Next, the second passivation layer 180$y$ and the first conductive layer 130 are etched by using the photosensitive film pattern 400 as a mask. In an exemplary embodiment, the first conductive layer may be wet-etched, and the second passivation layer 180$y$ may be dry-etched, and the dry-etched second passivation layer may include an undercut due to overetching.

Through etching, the first conductive layer 130 provides a common electrode portion 131$a$ having a pattern, and a plurality of second openings is defined in the second passivation layer 180$y$.

Some of the plurality of second openings expose the drain electrode 175 to correspond to the first opening, or expose the gate pad part 129 and the data pad part 179, and the other second openings which do not correspond to the plurality of first openings are provided on the organic film 80.

Next, a second conductive layer is laminated on the structure of FIGS. 17 to 19. In an exemplary embodiment, the first conductive layer 130 and the second conductive layer are laminated after the photosensitive film pattern 400 is removed. A part of the laminated second conductive layer is disposed on the common electrode 131, and the common electrode 131 is provided with a double layer structure.

Particularly, when the first conductive layer 130 and the second conductive layer include the same material, the thick common electrode 131 which has a double structure, but include the same material, is provided, and when the first conductive layer 130 and the second conductive layer include different materials, the common electrode 131 having the double layer structure 131a and 131b and including different materials of respective layers is provided.

In an exemplary embodiment, when the second conductive layer laminated on the common electrode 131 includes the same or similar material as or to the common electrode portion 131a, the conductive layer is again laminated on the common electrode portion 131a using TCO including ITO, IZO, or the like to have a large thickness, and as a result, slightly high line resistance may be effectively reduced.

Another part of the second conductive layer is provided in the plurality of second openings where the common electrode 131 is removed. Accordingly, the part of the second conductive layer may be provided at a part of the second opening exposing the drain electrode 175, exposing the gate pad part 129, or exposing the data pad part 179, and the other part may be provided in the second opening defined between the patterned common electrodes 131 and disposed on the organic film 80.

In summary, the pixel electrode 191 (refers to FIG. 2) is electrically connected to the drain electrode 175 through the third contact hole 184 and the openings corresponding thereto, the first contact assistant 81 (refers to FIG. 3) is positioned on the gate pad part 129 exposed through the first contact hole 181 and the openings corresponding thereto, and the second contact assistant 82 (refers to FIG. 4) is positioned on the data pad part 179 exposed through the second contact hole 182 and the openings corresponding thereto.

Further, the pixel electrode 191 and the common electrode 131 positioned in the pixel area form patterns which have different heights and are alternately positioned.

Further, the common electrode 131 according to the exemplary embodiment of the invention is provided with a double structure in which the first conductive layer 130 and the second conductive layer are laminated. Accordingly, the common electrode 131 may have a double layer structure 131a and 131b including different materials, or a thick double structure including the same material. That is, the common electrode 131 provided as described above may have a thickness larger than that of the pixel electrode 191, and for example, may have a thickness about two times larger than that of the pixel electrode 191.

Further, the pixel electrode 191 and the common electrode 131 may overlap with each other in the undercut region by the aforementioned undercut. The same function may be per provided without a separate storage electrode by overlapping. Accordingly, the storage electrode may be controlled by controlling the formation degree of the undercut when the etching is per provided.

In the manufacturing method of the TFT array panel according to the exemplary embodiment of the invention, the common electrode 131, the pixel electrode 191, and the second passivation layer 180y may be provided together by using one photomask. As a result, an increase of manufacturing costs of the LCD may be effectively prevented.

Figure 20:
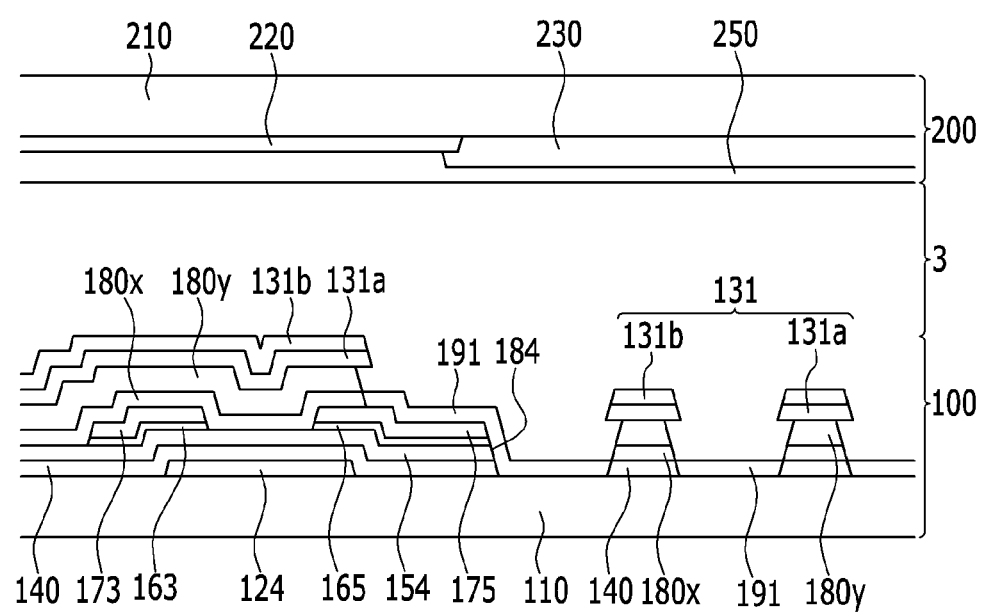
FIG. 20 is a cross-sectional view of another exemplary embodiment of the TFT array panel of FIG. 1 taken along line II-II according to the invention.
Figure 21:
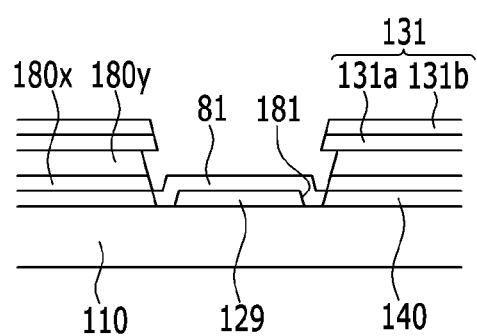
FIG. 21 is a cross-sectional view of another exemplary embodiment of the TFT array panel of FIG. 1 taken along line III-III according to the invention.
Figure 22:
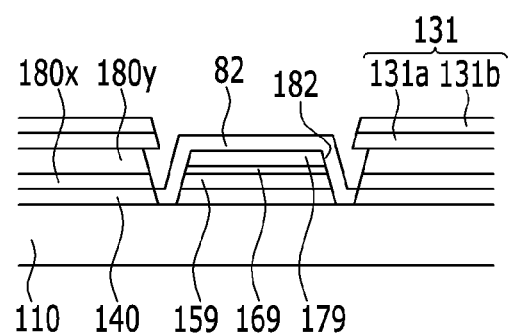
FIG. 22 is a cross-sectional view of another exemplary embodiment of the TFT array panel of FIG. 1 taken along line IV-IV according to the invention.

FIG. 20 is a cross-sectional view of the TFT array panel of FIG. 1 taken along line II-II according to another exemplary embodiment of the invention. FIG. 21 is a cross-sectional view of the TFT array panel of FIG. 1 taken along line III-III according to another exemplary embodiment of the invention. FIG. 22 is a cross-sectional view of the TFT array panel of FIG. 1 taken along line IV-IV according to another exemplary embodiment of the invention.

Each gate line 121 includes a plurality of gate electrodes 124 protruding downward, and a gate pad part 129 having a large area for connection with another layer or an external driving circuit. A gate driving circuit (not illustrated) generating a gate signal may be installed on a flexible printed circuit film (not illustrated) attached onto the first insulation substrate 110, or installed directly on the first insulation substrate 110.

In an exemplary embodiment, the gate conductor 121, 124, and 129 may be a single layer, or a multilayer including two or more conductive layers.

A gate insulating layer 140 is disposed on the gate conductor 121, 124, and 129. In an exemplary embodiment, the gate insulating layer 140 may include an inorganic insulator such as silicon nitride (SiNx) or silicon oxide (SiOx), or the like.

A semiconductor 154 is disposed on the gate insulating layer 140. Ohmic contacts 163 and 165 are disposed on the semiconductor 154.

In an exemplary embodiment, the semiconductor 154 may include an oxide semiconductor, and in the case where the semiconductor 154 is the oxide semiconductor, the ohmic contacts 163 and 165 may be omitted.

A data conductor including a data line 171 and a drain electrode 175 is disposed on the ohmic contacts 163 and 165.

The data line 171 transfers a data signal and extends in a substantially vertical direction to cross the gate line 121. Each data line 171 includes a source electrode 173 which extends toward the gate electrode 124, and a data pad part 179 having a large area for connection with another layer or an external driving circuit. In an exemplary embodiment, a data driving circuit (not illustrated) generating a data signal may be installed on a flexible printed circuit film (not illustrated) attached onto the first insulation substrate 110, or installed directly on the first insulation substrate 110.

The drain electrode 175 includes a rod-shaped end portion which faces the source electrode 173 based on the gate electrode 124, and the other end portion having a large area.

A first semiconductor 159 and a first ohmic contact 169 are disposed below the data pad part 179. In another exemplary embodiment, the first semiconductor 159 and the first ohmic contact 169 may be omitted.

The data conductor 171, 175, and 179 may be a single layer, or a multilayer including two or more conductive layers.

The gate electrode 124, the source electrode 173, and the drain electrode 175 form a TFT which is a switching element together with the semiconductor 154. The semiconductor 154 may have substantially the same planar shape as the data conductor 171, 175, and 179, except for a channel portion of the TFT.

A first passivation layer 180x is positioned on the data conductor 171, 175, and 179 and the exposed semiconductor 154, and the first passivation layer 180x may include an organic insulating material, an inorganic insulating material, or the like.

A plurality of first openings may be defined in the first passivation layer 180x.

Some of the plurality of first openings expose a part of the drain electrode, and other first openings are defined in the pixel area, expose the gate pad part 129, or expose the data pad part 179.

Next, a second passivation layer 180y is positioned on the first passivation layer 180x. A plurality of second openings is defined in the second passivation layer, and the plurality of second openings corresponds to the plurality of first openings. Accordingly, some of the second openings expose the drain electrode 175 to be electrically connected to the pixel electrode 191, others are positioned in the pixel area, and the others are positioned at the gate pad part 129 and the data pad part 179.

Further, the second passivation layer 180y may be etched to form an undercut while being etched to include the second opening.

Further, the second passivation layer 180y may include an organic insulating material or an inorganic insulating material.

The common electrode 131 is positioned on the second passivation layer 180y. In an exemplary embodiment, the common electrode 131 may include a transparent conductive material such as TCO including ITO, IZO, or the like. The common electrode 131 is positioned on the TFT in addition to the display area in which the plurality of pixels is positioned to display an image.

Further, since the common electrode 131 is provided by laminating the second conductive layer together with the first conductive layer during the formation, in the case where the first conductive layer and the second conductive layer include the same material, the common electrode 131 which has a double layer structure which has a large thickness and includes the same material is provided, and in the case where the first conductive layer and the second conductive layer include different materials, the common electrode 131 which has a structure of double layers 131a and 131b divided by different materials and has a large thickness is provided. In addition, the double layer structure due to separate materials has a large thickness.

Next, the pixel electrode 191, the first contact assistant 81, and the second contact assistant 82 are positioned in the first opening and the second opening described above. In an exemplary embodiment, the pixel electrode 191, the first contact assistant 81, and the second contact assistant 82 may also include a transparent conductive material such as TCO including ITO or IZO.

The pixel electrode 191 is electrically connected with the drain electrode 175 through the third contact hole 184 to receive the data voltage. The pixel electrodes 191 extend substantially parallel to each other and are separated from each other. In an exemplary embodiment, the pixel electrode 191 may have a linear shape, for example, but is not limited thereto and may have a curved shape together with the data line 171.

Referring to FIG. 21, the first contact assistant 81 is positioned on the gate pad part 129 exposed through the first contact hole 181 and the openings corresponding thereto, and the second contact assistant 82 is positioned on the data pad part 179 exposed through the second contact hole 182 and the openings corresponding thereto.

Further, the pixel electrode 191 and the common electrode 131 may overlap with each other in the undercut region by the aforementioned undercut. The same function may be performed without a separate storage electrode by the overlapping. Accordingly, the storage electrode may be controlled by controlling the formation degree of the undercut when the etching is performed.

The pixel electrode 191 receiving the data voltage generates an electric field in the liquid crystal layer (not illustrated) together with the common electrode 131 receiving the common voltage.

In the case of the TFT array panel according to the exemplary embodiment, the first passivation layer 180x, the second passivation layer 180y, the common electrode 131 and the pixel electrode 191 may be simultaneously provided by using one photomask. Accordingly, an increase of manufacturing costs of the TFT array panel may be effectively prevented.

The TFT array panel according to the exemplary embodiment may have a shape in which the common electrode 131 and the pixel electrode 191 are alternately positioned, and the common electrode 131 and the pixel electrode 191 may have the same shape.

FIGS. 23 to 34 are cross-sectional views illustrating a manufacturing method of a TFT array panel according to another exemplary embodiment of the invention.

Figure 23:
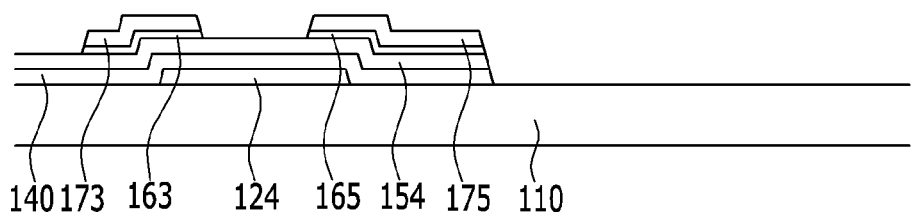
FIGS. 23 to 34 are cross-sectional views illustrating another exemplary embodiment of a manufacturing method of a TFT array panel according to the invention.
Figure 24:
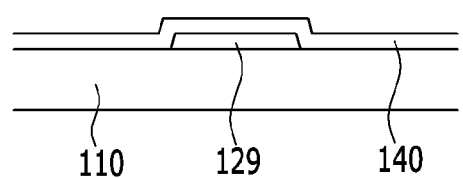
Figure 25:
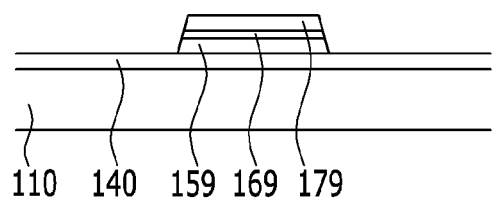

First, referring to FIGS. 23 to 25, the gate conductor 121, 124, and 129 including the gate line 121, the gate electrode 124, and the gate pad part 129 is disposed on the insulation substrate 110, and the gate insulating layer 140 is laminated thereon. The semiconductor 154, the first semiconductor 159, the ohmic contacts 163 and 165, the first ohmic contact 169, and the data conductor 171, 175, and 179 including the data line 171, the drain electrode 175, and the data pad part 179 are disposed on the gate insulating layer 140.

Figure 26:
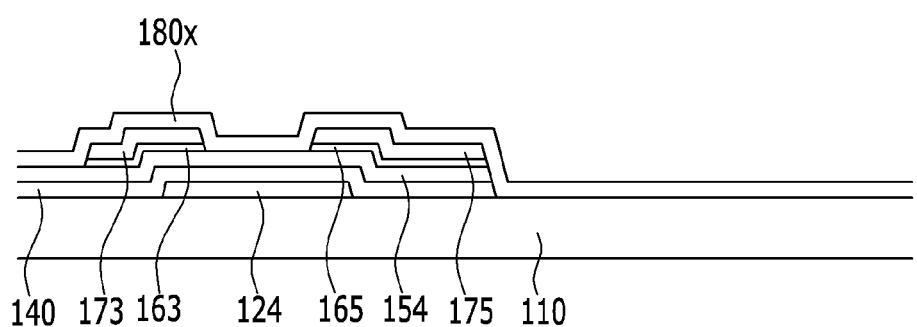
Figure 27:
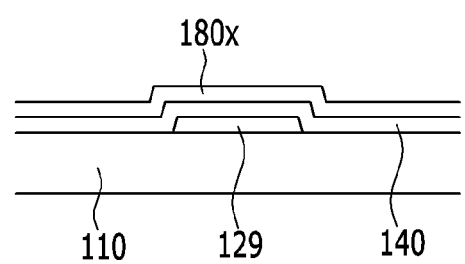
Figure 28:
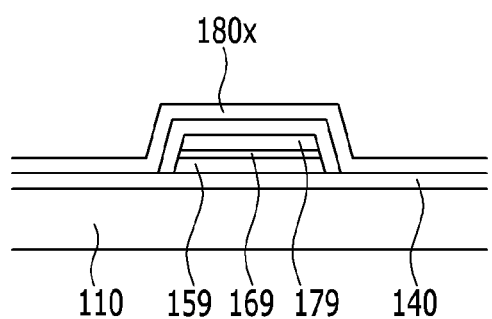

Next, as illustrated in FIGS. 26 to 28, the first passivation layer 180x is laminated on the gate insulating layer 140, the data conductor 171, 175, and 179, and the exposed semiconductor 154.

Figure 29:
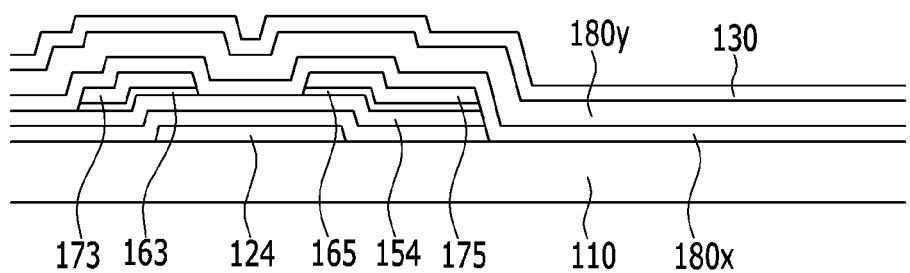
Figure 30:
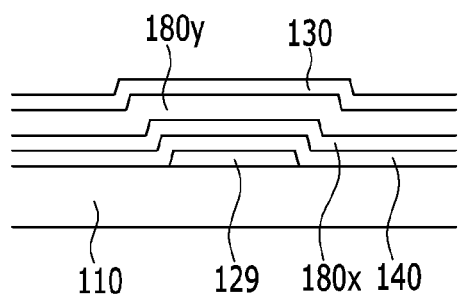
Figure 31:
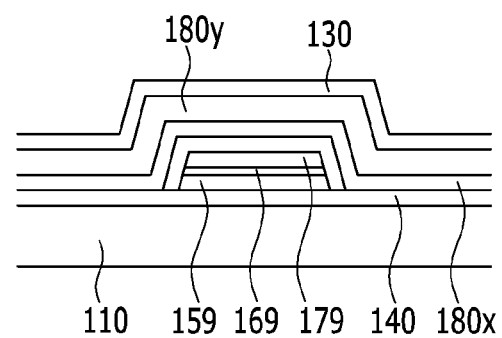

Next, as illustrated in FIGS. 29 to 31, the second passivation layer 180y is laminated on the first passivation layer 180x, and the first conductive layer 130 is laminated on the second passivation layer 180y.

Figure 32:
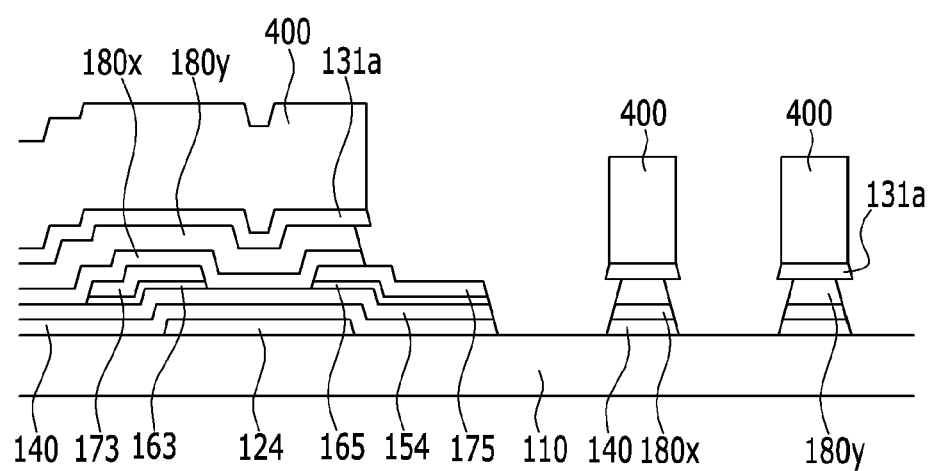
Figure 33:
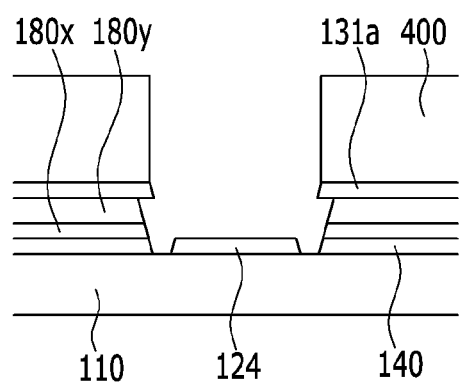
Figure 34:
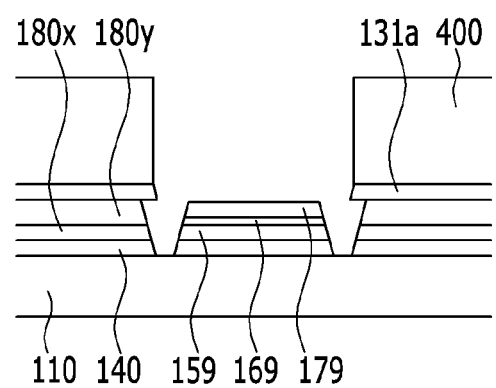

As illustrated in FIGS. 32 to 34, a photosensitive film pattern 400 is provided by laminating, exposing and developing a photosensitive film on the first conductive layer 130. Next, the first conductive layer 130 is etched by using the photosensitive film pattern 400 as a mask to form the common electrode portion 131a. In this case, the common electrode portion 131a may be etched by using wet-etching as an exemplary embodiment.

Subsequently, the second passivation layer 180y, the first passivation layer 180x, and the gate insulating layer 140 are etched at once by using the common electrode portion 131a and the photosensitive film pattern 400 as a mask. In this case, the etching may be dry-etching. That is, the same photosensitive film pattern 400 used for etching the first conductive layer 130 to form the common electrode portion 131a is used to etch the second passivation layer 180y, the first passivation layer 180x, and the gate insulating layer 140.

The plurality of first openings is defined in the first passivation layer 180x, and the plurality of second openings is defined in the second passivation layer 180y according to the etching. Further, the gate insulating layer 140 is etched to define the openings, but the openings do not completely correspond to the first openings or the second openings but are defined to correspond to some of the first openings or the second openings.

In detail, the gate insulating layer 140 is etched to define openings which correspond to the first openings or the second openings positioned in the pixel area or correspond to the first openings or the second openings positioned at the gate pad part 129 or the data pad part 179.

In this case, some of the openings defined in the first passivation layer 180x and the second passivation layer 180y correspond to the first contact hole 181 exposing the gate pad part 129 by etching the gate insulating layer 140, and other openings defined in the first passivation layer 180x and the second passivation layer 180y correspond to the second contact hole 182 exposing the data pad part 179 by partially etching the gate insulating layer 140. As such, the first passivation layer 180x, the second passivation layer 180y, and the common electrode 131 are etched by using one mask to have a self-alignment structure.

Next, as illustrated in FIGS. 20 to 22, the second conductive layer is laminated on a structure of the region in which the drain electrode 175 is exposed, the pixel area, and the gate pad part region according to FIGS. 17 to 19. In an exemplary embodiment, the first conductive layer 130 and the second conductive layer are laminated after the photosensitive film pattern 400 is removed. Through the lamination for the entire structure, the common electrode 131 including the common electrode portions 131a and 131b having the double layer structure with the large thickness is provided while a part of the second conductive layer is positioned on the common electrode portion 131a by the first conductive layer, and a part of the second conductive layer is positioned in an open region by the first opening and the second opening. The second conductive layer positioned in the first opening and the second opening may electrically contact the drain electrode 175, or be positioned on the first insulation substrate 110 corresponding to the pixel area.

The second conductive layer in the gate pad part 129 region contacts the gate pad part 129 to form the first contact assistant 81, and the second conductive layer in the data pad part 179 region contacts the data pad part 179 to form the second contact assistant 82.

That is, in spite of the uniform lamination, due to a step height by the common electrode 131, the first passivation layer 180x, and the second passivation layer 180y, the second conductive layer may form the pixel electrode 191 separated from the common electrode, the first contact assistant 81, and the second contact assistant 82 without a separate mask. Such a final structure is illustrated in FIGS. 20 to 22.

In summary, the pixel electrode 191 is electrically connected to the drain electrode 175 through the third contact hole 184 and some of the first openings and the second openings corresponding thereto, and some of the pixel electrodes 191 connected thereto may contact the first insulation substrate 110.

In addition, the first contact assistant 81 is positioned on the gate pad part 129 exposed through the first contact hole 181, and the second contact assistant 82 is positioned on the data pad part 179 exposed through the second contact hole 182.

Further, the pixel electrode and the common electrode may overlap with each other in the undercut region by the aforementioned undercut. The same function may be performed without a separate storage electrode by overlapping. Accordingly, the storage electrode may be controlled by controlling the formation degree of the undercut when the etching is performed.

In the manufacturing method of the TFT array panel according to the exemplary embodiment of the invention, the common electrode 131, the pixel electrode 191, the first passivation layer 180x, and the second passivation layer 180y may be provided together by using one photomask. Accordingly, an increase of manufacturing costs of the may be effectively prevented.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor array panel, comprising:
   a first insulation substrate;
   a gate line and a data line which are disposed on the first insulation substrate, are insulated from each other, and cross each other;
   a thin film transistor connected to the gate line and the data line;
   an organic film on the thin film transistor;
   a passivation layer which is disposed on the organic film and defines a plurality of openings therein;
   a common electrode directly on the passivation layer; and
   a pixel electrode disposed in the plurality of openings,
   wherein a thickness of the common electrode is larger than a thickness of the pixel electrode, and
   wherein the common electrode fully overlaps the passivation layer and defines a plurality of openings overlapping the plurality of openings of the passivation layer.

2. The thin film transistor array panel of claim 1, wherein:
   the common electrode has a double layer structure.

3. The thin film transistor array panel of claim 1, further comprising:
   a first passivation layer which is disposed on the thin film transistor and defines a plurality of first openings therein,
   wherein the passivation layer is a second passivation layer and the plurality of openings are a plurality of second openings, and
   the plurality of first openings overlap with some of the plurality of second openings.

4. The thin film transistor array panel of claim 1, wherein:
   the pixel electrode and a part of the common electrode overlap with each other, and provide a storage electrode.

5. A thin film transistor array panel, comprising:
   a first insulation substrate;
   a gate line and a data line which are disposed on the first insulation substrate, are insulated from each other, and cross each other;
   a thin film transistor connected to the gate line and the data line;
   a first passivation layer which is disposed on the thin film transistor and defines a first opening therein;
   a second passivation layer which is disposed on the first passivation layer and defines a second opening therein;
   a common electrode directly on the second passivation layer; and
   a pixel electrode positioned in the second opening,
   wherein a thickness of the common electrode is larger than a thickness of the pixel electrode, and
   wherein the common electrode fully overlaps the second passivation layer and defines a plurality of openings overlapping the second opening of the second passivation layer.

6. The thin film transistor array panel of claim 5, wherein:
   the first opening and the second opening are in plural and correspond to each other, respectively, and
   the common electrode has a double layer structure.

7. The thin film transistor array panel of claim 5, further comprising:
   a gate insulating layer disposed on the gate line.

8. The thin film transistor array panel of claim 5, wherein:
   the second passivation layer includes an undercut.

9. The thin film transistor array panel of claim 5, wherein:
the pixel electrode and a part of the common electrode overlap with each other, and provide a storage electrode.

10. The thin film transistor array panel of claim 5, wherein:
a part of the pixel electrode contacts the first insulation substrate.

* * * * *